(12) United States Patent
Clemow (10) Patent No.: US 9,224,382 B2
(45) Date of Patent: Dec. 29, 2015

(54) NOISE CANCELLATION (71) Applicant: Cirrus Logic International (UK) Ltd., Edinburgh (GB)

(72) Inventor: Richard Clemow, Gerrards Cross (GB)

(73) Assignee: Cirrus Logic International Semiconductor Ltd., Edinburgh (GB)

( * ) Notice: Subject to any disclaimer, the term of this patent is extended or adjusted under 35 U.S.C. 154(b) by 149 days.

(21) Appl. No.: 14/054,555

(22) Filed: Oct. 15, 2013

(65) Prior Publication Data

US 2014/0105413 A1    Apr. 17, 2014

Related U.S. Application Data (60) Provisional application No. 61/713,068, filed on Oct. 12, 2012.

(30) Foreign Application Priority Data

Oct. 12, 2012  (GB) .................................. 1218346.3

(51) Int. Cl.
*G10K 11/175* (2006.01)
*G10K 11/178* (2006.01)

(52) U.S. Cl.
CPC ............ *G10K 11/175* (2013.01); *G10K 11/178* (2013.01); *G10K 2210/3027* (2013.01); *G10K 2210/3028* (2013.01)

(58) Field of Classification Search
None
See application file for complete search history.

(56) References Cited

U.S. PATENT DOCUMENTS 5,937,070 A       8/1999  Todter et al.
2013/0028435 A1*  1/2013  Christoph .................... 381/71.6

FOREIGN PATENT DOCUMENTS

GB      2 441 835 A    3/2008
GB      2 455 823 A    6/2009

* cited by examiner

*Primary Examiner* — Paul Huber
(74) *Attorney, Agent, or Firm* — Jackson Walker L.L.P.

(57) ABSTRACT

A noise cancellation signal is generated by generating an ambient noise signal, representing ambient noise, and generating a noise cancellation signal, by applying the ambient noise signal to an feedforward filter, where the feedforward filter comprises a high-pass filter having an adjustable cut-off frequency, and by applying a controllable gain. The noise cancellation signal is then applied to a loudspeaker, to generate a sound to at least partially cancel the ambient noise. An error signal is generated, representing unwanted sound in the region of the loudspeaker. The phase of the ambient noise signal is compared to a phase of the error signal, and the gain is controlled on the basis of a result of the comparison, taking account of a phase shift introduced by the high-pass filter when performing the comparison.

17 Claims, 6 Drawing Sheets

NOISE CANCELLATION

This application claims the benefit of U.S. Provisional Application No. 61/713,068, filed on Oct. 12, 2012, the disclosure of which is herein incorporated by reference in its entirety.

BACKGROUND OF THE INVENTION

1. Field of the Invention

This invention relates to noise cancellation, and in particular to a noise cancelling system, and to a method for controlling a noise cancellation system. More specifically, the invention relates to adaptive feedforward noise cancellation systems.

2. Description of the Related Art

GB-2441835-A discloses an adaptive feedforward noise cancellation system, in which ambient noise is detected by an ambient noise microphone. The electrical signal representing the ambient noise is then applied to a feedforward filter, which generates a noise cancellation signal. The noise cancellation signal is passed to a loudspeaker, which generates sound based on the noise cancellation signal, with the intention that the sound based on the noise cancellation signal should be equal in amplitude but opposite in phase to the ambient noise reaching the user's ear, so that destructive interference takes place, and the ambient noise is at least partly cancelled.

An error microphone is provided, for detecting the sounds reaching the user's ear, namely the combination of the ambient noise and the sound based on the noise cancellation signal, and one or more characteristics of the feedforward filter are adjusted based on the signal received from the error microphone.

More specifically, GB-2441835-A recognises that, if the gain applied by the feedforward filter is too low, then the error microphone will detect some residual ambient noise. The effect of this will be that the signals generated by the ambient noise microphone and the error microphone will be substantially in phase. By contrast, if the gain applied by the feedforward filter is too high, then the ambient noise will be overcompensated so the effect of this will be that the signals generated by the ambient noise microphone and the error microphone will be substantially in anti-phase. GB-2441835-A therefore discloses that a determination as to whether the signals generated by the ambient noise microphone and the error microphone are in phase or in anti-phase can be used to control the gain applied by the feedforward filter to bring it to an optimum value.

However, this analysis assumes that the phase delay through the feedforward filter path does in fact match that required in order to cancel the acoustic ambient noise, so that the error microphone signal is indeed exactly in phase or exactly out of phase with the ambient noise microphone signal. If the frequency response characteristic of the electrical and/or acoustic feedforward paths includes some unanticipated phase delay, the effect of the control method described above is to try and minimise that component of the sound generated in response to the noise cancellation signal that is in phase with the ambient noise, regardless of any quadrature component. Thus, the noise cancellation is not optimised. One situation in which this can arise is in cases where, in order to remove wind noise from the ANC processing, there is a high-pass filter, which will introduce a consequent phase lead in the lower audio band, even above the corner frequency.

SUMMARY OF THE INVENTION

According to a first aspect of the present invention, there is provided a method of generating a noise cancellation signal, the method comprising:

generating an ambient noise signal, representing ambient noise;

generating a noise cancellation signal, by applying the ambient noise signal to an feedforward filter, wherein the feedforward filter comprises a high-pass filter having an adjustable cut-off frequency, and by applying a controllable gain;

applying the noise cancellation signal to a loudspeaker, to generate a sound to at least partially cancel the ambient noise; and generating an error signal, representing unwanted sound in the region of the loudspeaker, wherein the method further comprises:

comparing a phase of the ambient noise signal to a phase of the error signal, and controlling said gain on the basis of a result of said comparison, and taking account of a phase shift introduced by said high-pass filter when performing said comparison.

The step of taking account of the phase shift introduced by said high-pass filter may comprise adding the phase shift to the phase of the ambient noise signal before performing the comparison; subtracting the phase shift from the phase of the error signal before performing the comparison; or adjusting a threshold with which a phase difference between the phase of the ambient noise signal and the phase of the error signal is compared.

When performing said comparison, account may also be taken of a phase difference uncorrected by the feedforward filter.

The cut-off frequency of the high-pass filter may be adjusted based on a determination as to whether the ambient noise includes wind noise, and/or based on a determination as to whether a level of the noise cancellation signal, for example when combined with a level of a wanted sound signal, will overdrive the loudspeaker.

The method may comprise comparing the phase of the ambient noise signal to the phase of the error signal in each of a plurality of analysis frequency bands, and controlling said gain on the basis of a result of said comparisons.

According to a second aspect of the present invention, there is provided a computer program product, comprising code for causing a computer, such as a digital signal processor, to perform the method according to the first aspect of the invention.

According to a third aspect of the present invention, there is provided a noise cancellation system configured to operate according to method according to the first aspect of the invention.

According to a fourth aspect of the present invention, there is provided a sound reproduction device, comprising a noise cancellation system according to the third aspect of the invention.

The sound reproduction device may comprise a handset, having a loudspeaker, a noise microphone, for detecting ambient noise, and an error microphone, positioned in front of the loudspeaker for detecting unwanted sound entering an ear canal of a user, when the handset is being held to an ear of the user.

According to a fifth aspect of the present invention, there is provided a sound reproduction system, comprising a sound reproduction device according to the fourth aspect of the invention, and at least one earphone, which may for example be a supra-aural earphone or an intra-concha earphone.

The sound reproduction system may further comprise a loudspeaker, a noise microphone, for detecting ambient noise, and an error microphone, positioned in front of the loudspeaker for detecting unwanted sound entering an ear canal of a wearer, when the earphone is being worn normally.

BRIEF DESCRIPTION OF THE DRAWINGS

For a better understanding of the present invention, and to show how it may be brought into effect, reference will now be made, by way of example, to the accompanying drawings in which:—

DETAILED DESCRIPTION OF THE PREFERRED EMBODIMENTS

Figure 1:
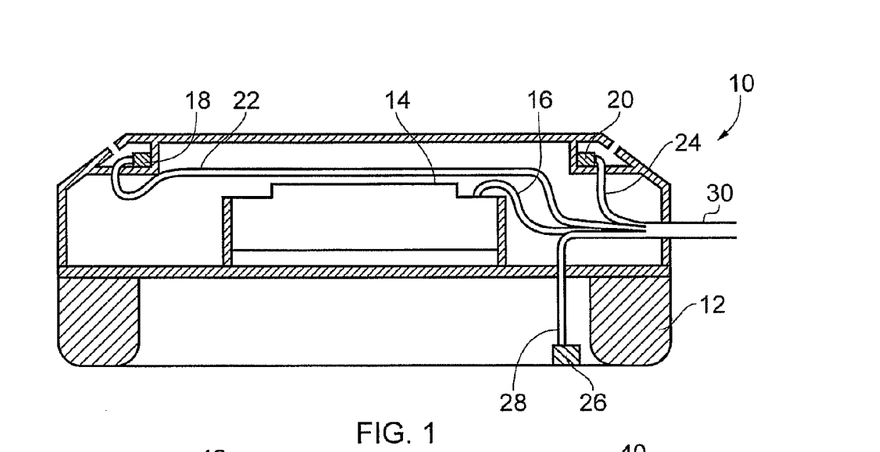
FIG. 1 illustrates a first earphone, in accordance with an embodiment of the invention.

FIG. 1 shows an earphone 10, more specifically a supra-aural earphone, having a pad 12 that rests on the outer ear of a wearer.

Electrical signals are passed to a speaker 14 along a wire 16, so that the speaker 14 can generate sound in response thereto, and the sound will be directed towards the ear of a wearer in normal use.

In this illustrated embodiment, there are two microphones 18, 20, positioned near the outward-facing side of the earphone 10, so that they detect ambient noise as it approaches the ear of the wearer. Signals from the microphones 18, 20 are passed along respective wires 22, 24. It will be appreciated that there may be only a single ambient noise microphone, or there may be more than two such microphones.

In addition, there is an error microphone 26, positioned in front of the speaker 14 so that it detects sounds at or near the entrance to the wearer's ear canal. The signal generated by the error microphone 26 is passed along a wire 28.

The wires 16, 22, 24, 28 are combined in a cable 30, which can be connected to a sound reproduction device, such as a portable music player, games console, or the like.

Figures 2, 3:
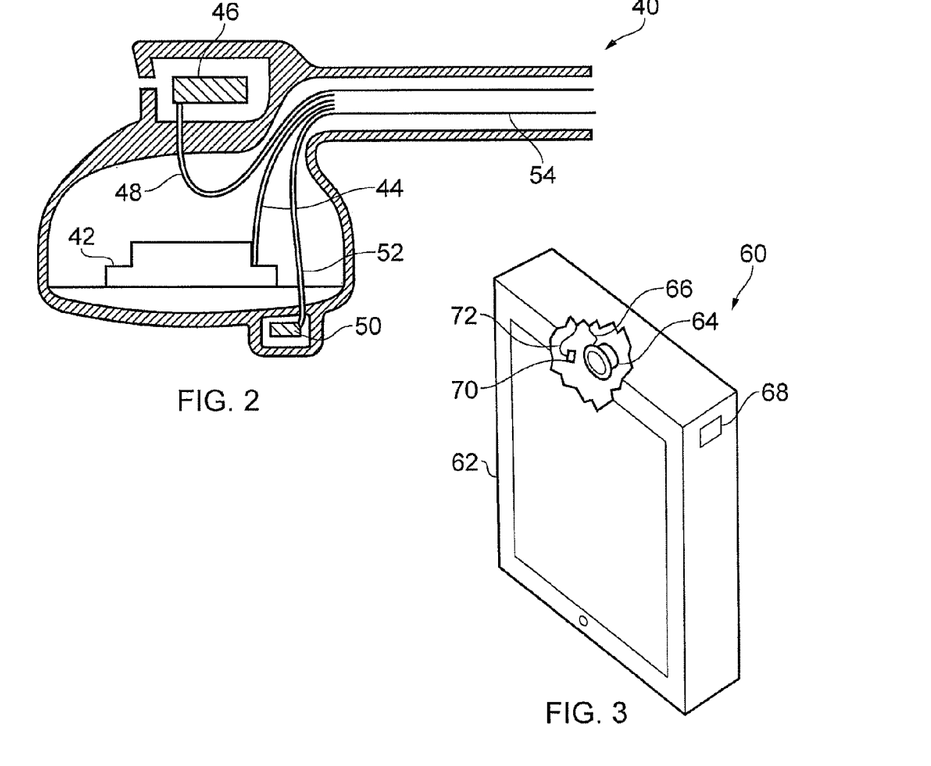
FIG. 2 illustrates a second earphone, in accordance with an embodiment of the invention.
FIG. 3 illustrates a handset, in accordance with an embodiment of the invention.

FIG. 2 shows an earphone 40, more specifically an intra-concha earphone, of the type that fits in the outer ear of a wearer.

Electrical signals are passed to a speaker 42 along a wire 44, so that the speaker 42 can generate sound in response thereto, and the sound will be directed towards the ear of a wearer.

A microphone 46 is positioned near the outward-facing side of the earphone 40, so that it detects ambient noise as it approaches the ear of the wearer. Signals from the microphone 46 are passed along a wire 48. In some embodiments, in particular when the earphone is a supra-aural earphone rather than an intra-concha earphone as here, there may be more than one such microphone.

In addition, there is an error microphone 50 positioned in front of the speaker 42 so that it detects sounds at or near the entrance to the wearer's ear canal. The signal generated by the error microphone 50 is passed along a wire 52. In this and other embodiments, there may be more than one error microphone, positioned so that together they generate a signal that best represents the sound entering the wearer's ear canal.

The wires 44, 48, 52 are combined in a cable 54, which can be connected to a sound reproduction device, such as a portable music player, games console, or the like.

FIG. 3 shows a handset 60, partially cut away to show components in the interior of the handset body 62. Specifically, electrical signals are passed to a speaker 64 along a wire 66, so that the speaker 64 can generate sound in response thereto, and the sound will be directed towards the ear of a wearer, when the handset is held in its normal use position.

A hole 68 is provided on the upper part of a side surface of the handset body 62 (and another such hole, not illustrated, can be provided on the opposite side of the handset). A microphone (not shown in FIG. 3) is positioned near this (or each) outward-facing hole 68, so that it detects ambient noise as it approaches the ear of the wearer. Alternatively, a noise microphone can be positioned on the rear of the handset, for example in the upper part of the rear surface. Signals from the noise microphone (or microphones) are passed to a processor within the handset 60.

In addition, there is an error microphone 70 that detects sounds from the speaker 64. The error microphone 70 may be positioned so that it detects sounds at or near the entrance to the wearer's ear canal. The signal generated by the error microphone 70 is passed along a wire 72 to the processor within the handset 60.

Figure 4:
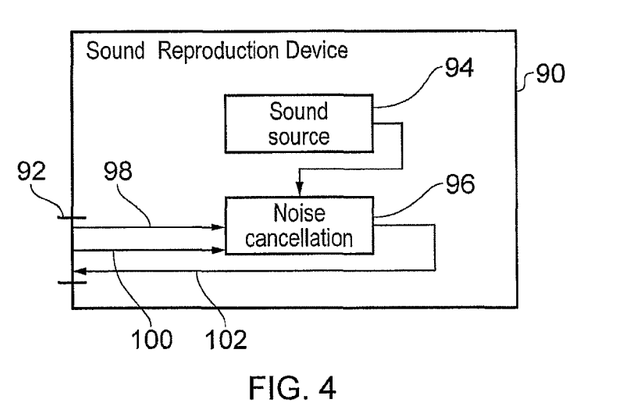
FIG. 4 is a schematic diagram, illustrating the form of a sound reproduction system, in accordance with an embodiment of the invention.

FIG. 4 is a schematic diagram, illustrating a sound reproduction device 90. For example, the sound reproduction device 90 may take the form of a portable music player, games console, or the like.

The sound reproduction device 90 has a jack 92, for receiving a cable connected to a pair of earphones, neither of which are illustrated. Each earphone may be of the form shown in FIG. 1 or 2.

The sound reproduction device 90 includes a sound source 94, which may for example be an MP3 decoder or other form of decoder, and/or an FM radio receiver or the like, and which generates electrical signals that represent sounds that the user hears. The output of the sound source 94 is connected to a noise cancellation block or circuit 96, which generates an output signal for application to the speaker of an associated listening device such as an earphone.

The noise cancellation block 96 receives input signals on lines 98, 100, the input signals being at least an ambient noise signal, representing the ambient noise approaching the earphone, and an error signal, representing the sounds at or near the entrance to the wearer's ear canal, respectively.

Based on these input signals, the noise cancellation block 96 generates an output signal, for output along a line 102 to the earphone, with the output signal containing the wanted signal, plus a noise cancellation signal that will attempt to interfere destructively with the ambient noise, and hence provide noise reduction.

In another embodiment, the sound reproduction device takes the form of a handset, such a mobile telephone handset, in which case the sound source takes the form of a radio transceiver and associated baseband circuitry for generating signals that represent the speech of a person calling the mobile telephone. In addition, the sound reproduction device will typically be included within the handset that also contains the speaker, the noise microphone(s) and the error microphone, and so the connection between them is by internal wires, without requiring a cable and jack connection.

In still another embodiment, the noise cancellation block is provided in a headphone, which has a cable for connection to a sound reproduction device such as a portable music player, games console, mobile telephone handset, or the like. The headphone then receives the wanted sound signal, while all noise cancellation processing takes place in the headphone.

Figure 5:
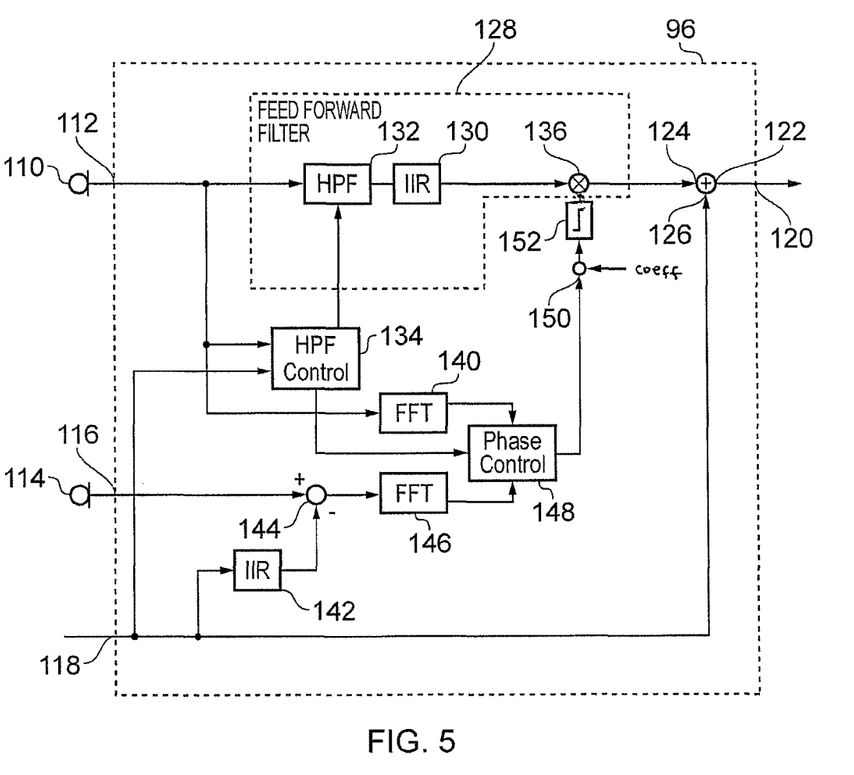
FIG. 5 is a schematic diagram, illustrating the form of a noise cancellation system, in accordance with an embodiment of the invention.

FIG. 5 illustrates the noise cancellation block 96, in a first embodiment. FIG. 5 illustrates the function of the noise cancellation block 96 as being performed in separate blocks. However, it will be appreciated that many of the functions can conveniently be carried out in one or more digital signal processor (DSP) circuit, and so an aspect of the invention relates to the control instructions for causing a DSP circuit to perform some or all of the relevant functions.

As described above, the noise cancellation block 96 receives an input from at least one ambient noise microphone 110 on a first input terminal 112. When there is more than one ambient noise microphone, the signals from the microphones are typically added together to produce a combined ambient noise signal.

The noise cancellation block 96 also receives an error signal from at least one error microphone 114 on a second input terminal 116. The error signal represents the sounds at or near the entrance to the user's ear canal.

The noise cancellation block 96 also receives a wanted sound signal from a sound source on a third input terminal 118.

The aim of the noise cancellation block 96 is to generate an output signal on its output terminal 120, which can be applied to a transducer placed near to the user's ear, and which will then generate the wanted sounds but will also generate sounds that at least partly cancel the ambient noise reaching the user's ear. Thus, the output signal is the output of an adder 122, which receives a noise cancellation signal on its first input 124 and receives the wanted sound signal on its second input 126.

The noise cancellation signal is generated by applying the ambient noise signal received on the first input terminal 112 to a feedforward filter 128. As is known, the ambient noise that reaches the user's ear is not the same as the ambient noise that is detected by the ambient noise microphone 110. For example, the presence of the earphone close to the user's ear causes frequency-dependent changes in the amplitude and phase of the ambient noise that reaches the user's ear. In addition, the ambient noise microphone 110 and the loudspeaker in the earphone also have frequency dependent amplitude and phase characteristics.

In order to achieve perfect noise cancellation, it is required that the feedforward filter 128 should filter the ambient noise signal to generate a noise cancellation signal that exactly compensates for these frequency-dependent characteristics of the acoustic path from the ambient noise microphone to the user's ear, and of the noise microphone and the loudspeaker.

In practice, such perfection cannot be achieved, but the digital feedforward filter 128 includes an infinite impulse response (IIR) filter 130, in the form of a fixed, relatively low-order (for example $10^{th}$ order) filter. The frequency-dependent characteristic of the IIR filter 130 is designed to be as close as possible to the ideal characteristic, given the constraint imposed by the relatively low order filter. Of course, other filter structures such as FIR filters can be used if desired.

The feedforward filter 128 also includes a high-pass filter 132, whose cut-off frequency can be adjusted. The purpose of the high-pass filter 132 is to optimise the filter response to deal with certain situations. FIG. 5 shows the high-pass filter 132 located before the IIR filter 130, which has the advantage that the amplitude of the signals at low frequencies is reduced before they are passed to the IIR filter. As the IIR filter 130 will typically boost the amplitude of the signals at low frequencies, this arrangement will reduce the headroom required in the filter. However, the order of the filters in the feedforward path is not crucial.

For example, when the device is used in windy conditions, the ambient noise microphone(s) will detect the wind. However, because the wind is turbulent, it is not possible to define adequately the frequency-dependent characteristics of the acoustic path from the ambient noise microphone to the user's ear. As a result, it is not possible to generate a noise cancellation signal that cancels the wind noise. In this embodiment, therefore, the amplitude of the wind is determined and, when the amplitude of the wind exceeds a threshold value, steps are taken to alter the generation of the noise cancellation signal. Specifically, since the wind noise is predominantly at low frequencies, the low frequency component of the ambient noise signal is filtered out to some extent by adjusting the cut-off frequency of the high-pass filter 132. The details of this process are described in Patent Application GB-1204660.3, but it is not necessary to describe this control in detail to explain the present invention.

As another example, if the device is to be used in situations with high levels of ambient noise, the noise cancellation block would tend to try and achieve noise cancellation by generating a large amplitude noise cancellation signal. However, this might mean that the signal to be applied to the loudspeaker (being the sum of the noise cancellation signal and the wanted signal) would be beyond the capability of the loudspeaker to handle signals. Patent Application GB-2455823-A discloses that this problem can be mitigated by adapting the cut-off frequency of the high-pass filter 132.

Therefore, the noise cancellation block 96 includes a high-pass filter cut-off control block 134, which receives the ambient noise signal, and optionally also a signal from a second noise microphone (not shown in FIG. 5), in order to determine whether wind noise is being detected. The HPF control block 134 also receives the wanted sound signal, and determines on the basis of the ambient noise signal and the wanted sound signal whether there is a potential issue with overdriving the loudspeaker. Based on these two factors, the HPF control block 134 generates an output control signal that is passed to the HPF 132 to adjust a cut-off frequency thereof.

The HPF 132 may be a simple first order filter with a single cut-off frequency, or may have a more complex characteristic that allows the frequency response to be adjusted in more detail in response to different conditions. However, the relatively lower frequency signal components will be attenuated by the HPF 132, and so they will not appear in the noise cancellation signal, while the relatively higher frequency components will just pass through the HPF 132. In order to exclude wind noise, or prevent excessive speaker excursion, the cut-off frequency of the HPF 132 might for example need to be set to between 200 Hz and 300 Hz.

However, components at frequencies up to, say, ten times the cut-off frequency will still be subject to a significant phase delay. If the cut-off frequency is set to 200 Hz, this means that there will be a significant phase delay applied to all frequencies within the practical noise cancellation range.

The filtered ambient noise signal is passed to a multiplier 136, which applies a controllable gain to generate the noise cancellation signal.

The amount of the controllable gain is determined in a manner that builds upon the principle described in UK Patent GB-2441835B, in that it compares the phases of the signals generated by the ambient noise microphone and the error microphone. However, the details of the comparison, and the determination of the amount of gain, are significantly developed from that earlier disclosure, as described below.

Thus, the ambient noise signal is applied to a first Fast Fourier Transform (FFT) block 140, which determines the magnitudes and phases of components of the ambient noise signal in various frequency bands. In this embodiment, the components of the ambient noise signal are extracted in multiple analysis frequency bands within the audio frequency range, preferably within a part of the audio frequency range over which noise cancellation works consistently in different devices and under different conditions.

In this illustrated embodiment, the wanted sound signal is also applied to a filter 142, in this case an infinite impulse response (IIR) filter. This has a frequency characteristic that represents the transfer function through the loudspeaker and the error microphone 114. Thus, the output of the filter 142 represents the component of the wanted sound that is detected by the error microphone 114.

The input signal from the error microphone 114 is then applied to a first input of a subtractor 144, while the output of the filter 142 is applied to a second input of the subtractor 144. The output signal of the subtractor 144 therefore represents the unwanted sound reaching the ear of the user, namely any ambient noise that has not been cancelled by the noise cancellation signal and/or any excess sound generated in response to the noise cancellation signal.

In an alternative embodiment, it is possible to ignore the fact that the wanted signal will be detected by the error microphone 114, and to remove the filter 142 and the subtractor 144. In that case, it is possible to rely on the fact that the wanted signal is uncorrelated with the ambient noise signal. This means that the wanted signal is equally likely to increase or decrease the result of the phase comparison, described below, which in turn means that it is equally likely to increase or decrease the gain adjustment. By including a sufficiently slow response to the gain adjustment (e.g. low-pass filtering the gain control signal), these fluctuations are filtered out, and the net result is that the desired signal does not affect the performance of the adaptive system.

The output of the subtractor 144 is applied to a second Fast Fourier Transform (FFT) block 146, which determines the magnitudes and phases of components of the unwanted sound signal in various frequency bands. In this embodiment, the FFT block 146 extracts the components of the ambient noise signal in the multiple analysis frequency bands mentioned above.

Although reference is made here to the use of first and second Fast Fourier Transform (FFT) blocks 140, 146 in this embodiment, it will be noted that other techniques, such as a Discrete Fourier Transform (DFT) or the Goertzel algorithm, can be used when appropriate.

The outputs of the first and second Fast Fourier Transform (FFT) blocks 140, 146 are then passed to a phase comparator 148, where, in each of the multiple analysis frequency bands discussed above, the difference between each of the phases is compared with a threshold value. The results of these comparisons are then used to determine whether the gain value being applied in the multiplier 136 is too large or too small. In one embodiment, a simple majority vote among the results is used to produce a binary outcome as to whether the gain is too large or too small. In other embodiments, the exact number of results higher or lower than the threshold can be used to produce an outcome that gives more weight to a larger majority vote that the gain is too large or too small. In still further embodiments, a second or higher order control system can be used instead of the first order control system described here.

Thus, successive comparison results are scaled by a suitable coefficient by means of a multiplier 150, and are then summed in an integrator 152 to generate a control signal that is used to adjust the gain value applied in the multiplier 136. For example, in one embodiment, the FFT blocks 140, 146 receive signals at a sample rate of 8 kHz, and so one result is generated in each frequency band on each block of 128 consecutive samples, to produce an output that can increase or decrease the gain value applied in the multiplier 136, for example in 0.1 dB steps.

If it could be assumed that the feedforward filter 128 were such that the sound generated by the loudspeaker in response to the noise cancellation signal would be exactly out of phase with the ambient noise reaching the ear of the user, then, if the gain applied by the feedforward filter were too low, the error microphone would detect some residual ambient noise. The effect of this would be that the ambient noise signal and the unwanted component of the error signal would be substantially in phase. By contrast, if the gain applied by the feedforward filter were too high, then the ambient noise would be completely cancelled, but the error microphone would detect some residual component of the noise cancellation signal. The effect of this would be that the ambient noise signal and the unwanted component of the error signal would be substantially in antiphase.

However, it cannot be assumed that the feedforward filter 128 is such that the sound generated by the loudspeaker in response to the noise cancellation signal will be exactly in antiphase with the ambient noise reaching the ear of the user. For example, the presence of the high-pass filter 132 means that the noise cancellation signal will be subject to a frequency-dependent phase delay, which will depend on the cut-off frequency of the HPF 132.

The effect of this can be described as follows:—

As is common in analysing noise cancellation systems, we can define various transfer functions associated with different components of the system:

$H_{AM}$=transfer function from ambient to ambient noise microphone
$H_{AE}$=acoustic transfer function from ambient to ear
$H_{DE}$=transfer function from loudspeaker (driver) to ear
$H_{ME}$=transfer function from ambient noise microphone to ear
$H_{IIR}$=fixed IIR noise cancellation filter response
$H_{HPF}$=adaptive high-pass filter response
G=actual gain applied in noise cancellation filter
$G_{target}$=gain for optimum noise cancellation (which depends on the sound leakage)

Thus:

$$H_{ME}=H_{AE}/H_{AM}$$

To achieve optimum noise cancellation, the noise cancellation filter transfer function needs to be:

$$H_{IIR}=H_{ME}/H_{DE}.$$

The signal detected by the ambient noise microphone is therefore proportional to $H_{AM}$, while the signal detected by the error microphone is proportional to:

$$H_{AE}=H_{AM}\cdot(G/G_{target})\cdot H_{IIR}\cdot H_{HPF}\cdot H_{DE}$$

The ratio of the signal detected by the error microphone to the signal detected by the ambient noise microphone is therefore:

$$H_{ME}-(G/G_{target})\cdot H_{IIR}\cdot H_{HPF}\cdot H_{DE}=H_{ME}\cdot[1-(G/G_{target})\cdot H_{HPF}]$$

Assuming that $H_{ME}$ in this equation has zero phase, and that $H_{HPF}$ also has zero phase, the phase element of this becomes:

$$\text{phase(error:ambient)}=\text{phase}[1-(G/G_{target})]$$

So, when the gain ratio ($G/G_{target}$) is less than 1 (i.e. the gain is too small and needs to be increased), the phase of the error/ambient ratio is 0 degrees, and when the gain ratio is greater than 1 (the gain is too large and needs to be reduced), the phase of the error/ambient ratio is 180 degrees.

However, when the phase $H_{HPF}$ of the high-pass filter is taken into consideration, the situation becomes more complex. Specifically, the phase element of the ratio of the signal detected by the error microphone to the signal detected by the ambient noise microphone is:

$$\text{phase(error:ambient)}=\text{phase}[1-(G/G_{target})\cdot H_{HPF}]$$

Figure 6:
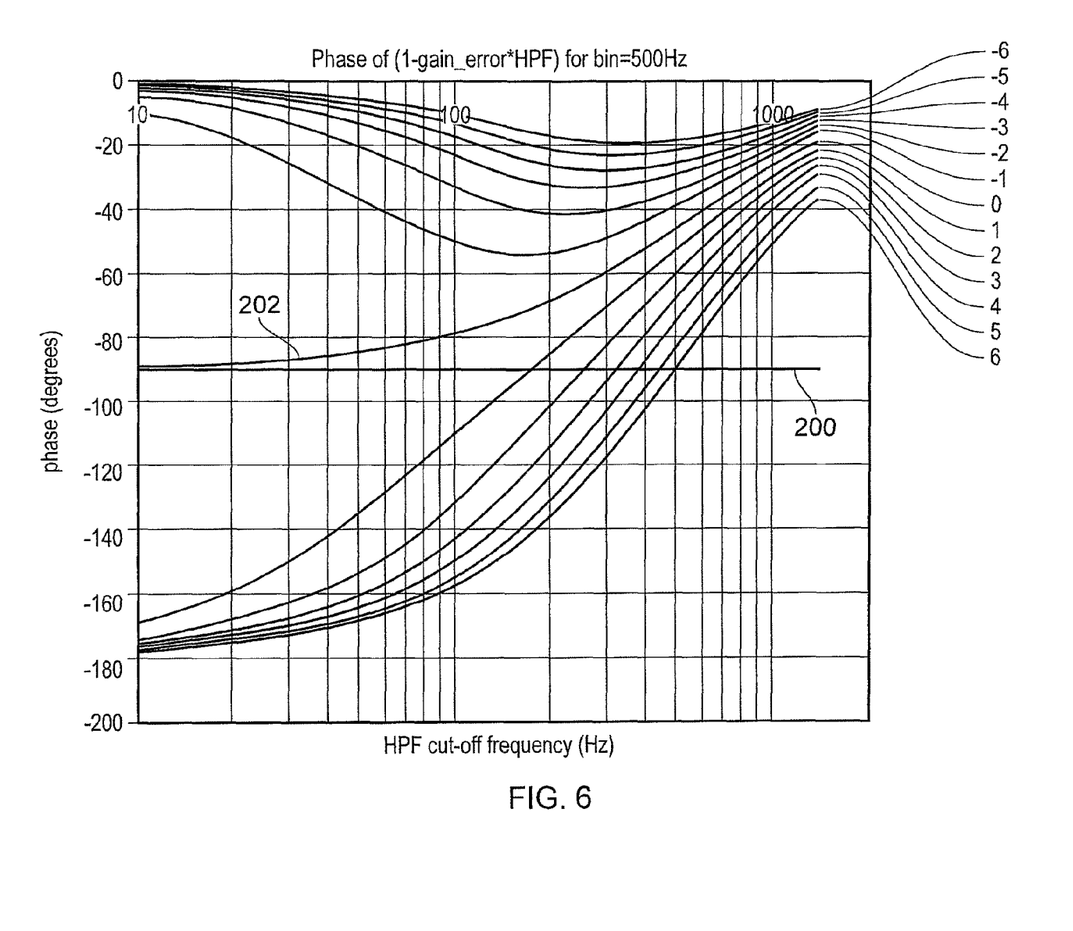
FIG. 6 illustrates an effect of varying a cut-off frequency of a high-pass filter in the noise cancellation system of FIG. 5.

FIG. 6 illustrates this effect. More specifically, FIG. 6 shows the variation of this phase with changes in the cut-off frequency of the high-pass filter, for different values of the gain ratio ($G/G_{target}$) between −6 dB and +6 dB. This variation is a function of frequency, and so FIG. 6 shows the variation at a measurement frequency of 500 Hz.

It can be seen that, at the left hand side, when the cut-off frequency of the high-pass filter is very low, the situation becomes very similar to that described above. The frequency response of the high-pass filter, $H_{HPF}$, effectively has zero phase. Therefore, for all values of the gain ratio less than 1 the phase is close to 0 degrees, while for all values of the gain ratio greater than 1 the phase is close to −180 degrees. A gain ratio of −6 dB produces a phase which is closest to 0 degrees, while a gain ratio of +6 dB produces a phase which is closest to −180 degrees, with the phase decreasing for each increase in the gain ratio.

In this situation, accurate results can be achieved by setting a threshold value of −90 degrees, as shown by the line 200, and determining whether the measured phase is above or below the threshold to determine whether the gain needs to be increased or decreased.

However, at different values for the cut-off frequency of the high-pass filter, the value of the gain ratio has different effects on the phase. The line 202 indicates the form of the phase threshold that is actually required. Thus, if for example the HPF cut-off frequency is 100 Hz, the phase threshold should be set to −80 degrees, rather than −90 degrees, and if the HPF cut-off frequency is 300 Hz, the phase threshold should be set to −60 degrees.

FIG. 6 also shows that, for higher values of the cut-off frequency there is less distinction between cases where the gain is too high and cases where it is too low. For example, at an HPF cut-off frequency of 20 Hz, a gain error of +/−1 dB causes a +/−70 degree phase swing either side of the average of −88 degrees; at an HPF cut-off frequency of 100 Hz, a gain error of +/−1 dB causes a +/−30 degree phase swing either side of the average of −80 degrees; while at an HPF cut-off frequency of 400 Hz, a gain error of +/−1 dB causes a +/−8 degree phase swing either side of the average of −52 degrees.

FIG. 5 therefore shows that a control signal is sent from the HPF control block 134 to the phase comparator block 148. This control signal indicates the cut-off frequency that has been set for the HPF 132. Based on this, the phase comparator can determine, for each of the analysis frequency bins at which the FFT blocks 140, 146 generate data, a suitable value for the phase comparison threshold.

Specifically, based on the characteristics of the high-pass filter, a polynomial equation (for example a quartic equation) can be fitted to the real and imaginary component curves that represent the curve 202 shown in FIG. 6, and the coefficients of the polynomial can then be stored in advance, in a look-up-table (LUT) for example. This characterisation process can be repeated for each of the multiple analysis frequency bands at which the FFT blocks 140, 146 generate data, and at which the phase comparison results are generated. Then, in use, when the HPF control block 134 sets the cut-off frequency of the HPF filter 132, these polynomials are used to find, for each of the frequency bands, a phase comparison threshold.

The phase comparator 148 can then determine, for each of these frequency bins, whether the phase of the ratio exceeds the chosen value for the phase comparison threshold, and the gain applied in the multiplier 136 can be controlled on that basis.

Figure 7:
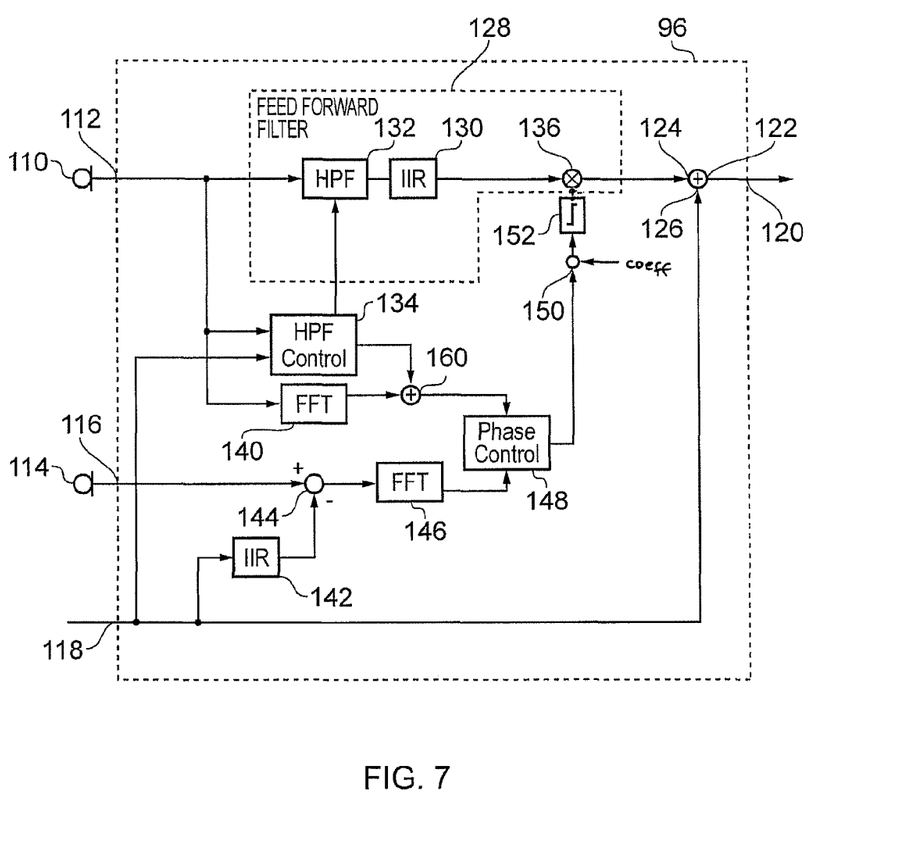
FIG. 7 is a schematic diagram, illustrating the form of a second noise cancellation system in accordance with an embodiment of the invention.

FIG. 7 shows an alternative form of the noise cancellation block 96. The noise cancellation block 96 shown in FIG. 7 is largely the same as that shown in FIG. 5, and so it will not be described in further detail.

However, rather than using the information about the cut-off frequency of the HPF 132 to set a threshold value for use in the phase comparator 148, this information is instead passed to an adder 160 and the phase offset is added to the calculated phase of the ambient noise signal, before this is compared with the phase of the error signal, with the result being compared with a threshold of −90 degrees. Thus, the same result is achieved, but this has the advantage that it is more easily computed.

Specifically, it is not in fact necessary to compute any phases; rather the complex FFT data can be used directly. The phase of the HPF is represented by means of a complex number with a magnitude of 1 and a phase equal to the HPF phase. It has been found that this complex number can be determined from the HPF register control value with sufficient accuracy by using one quartic equation to obtain the real part and another quartic equation to compute the imaginary part. This requires eight multiply operations.

These complex numbers are then multiplied by the reference signal FFT bin complex value (requiring two multiply operations) to provide a phase-corrected reference signal. An additional step is then required to resolve a quadrant ambiguity, by testing the sign of the vector cross product of the compensated reference signal and the error signal (requiring two multiply operations). To test the relative phase of the phase-compensated reference and the error is a simple operation, by testing the sign of the vector dot product of the two (requiring two multiply operations). The total requirement is therefore only fourteen multiply operations per frequency bin, and it is not necessary to compute any actual phase values, which would require forming the arctan of the ratio of the real part to the imaginary part of each value.

Figure 8:
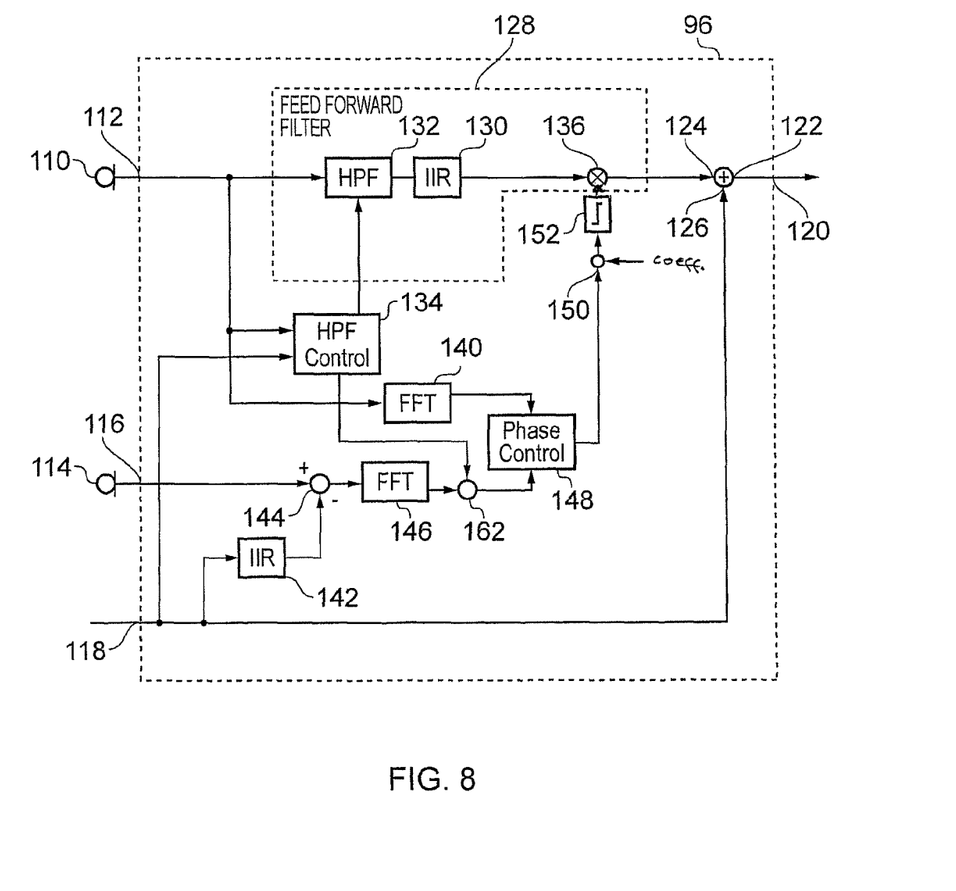
FIG. 8 is a schematic diagram, illustrating the form of a third noise cancellation system in accordance with an embodiment of the invention.

FIG. 8 shows a further alternative form of the noise cancellation block 96, which achieves the same result in an equivalent but slightly different manner. The noise cancellation block 96 shown in FIG. 8 is largely the same as that shown in FIG. 5, and so it will not be described in further detail.

However, in this case, the information about the cut-off frequency of the HPF 132 is passed to a subtractor 162 and the phase offset is added to the calculated phase of the error signal, before this is compared with the phase of the ambient noise signal, with the result being compared with a threshold of −90 degrees. Thus, the same result is achieved.

As described above, the methods may be implemented in a noise cancellation system in which the noise cancellation signal is generated by means of a fixed IIR filter, of relatively low order, with the characteristic of that filter being set as close as possible to the ideal filter characteristic required for perfect noise cancellation (which would be the transfer function from the loudspeaker to the ear, multiplied by the inverse of the transfer function from the ambient noise microphone to the ear, i.e. $H_{IIR}=H_{ME}/H_{DE}$ as discussed above).

Figure 9:
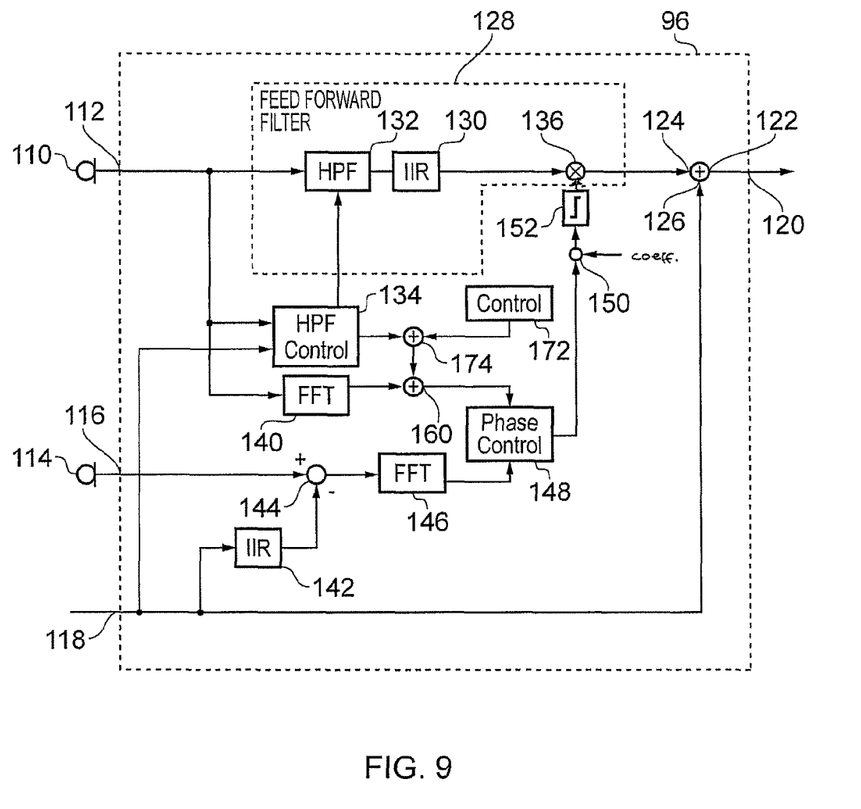
FIG. 9 is a schematic diagram, illustrating the form of a fourth noise cancellation system in accordance with an embodiment of the invention.

However, this use of a fixed IIR filter means that there will in practice always be some phase error that cannot be compensated. FIG. 9 therefore shows an alternative form of the noise cancellation block 96, in which steps are taken to correct for this error between the fixed IIR filter response and the ideal filter response. The noise cancellation block 96 shown in FIG. 9 is largely the same as that shown in FIG. 7, and so it will not be described in further detail.

As mentioned above, this embodiment recognises that it is impossible to produce an IIR filter 130 that perfectly cancels the ambient noise. That is, there is an error, denoted here by the transfer function $H_{MERR}$, between the fixed IIR filter response and the ideal filter response.

The transfer function $H_{MERR}$ is determined by a control block 172, which in this illustrated embodiment contains data that define the transfer function, with this data having being fixed during a characterisation and calibration phase, based on acoustic measurements of the properties of the loudspeaker and the ambient noise microphone(s), for example. In other embodiments, the control block 172 could receive input signals relating to one or more system parameters, and could then set the transfer function $H_{MERR}$ as required.

In one embodiment, the transfer function $H_{MERR}$ simply provides a constant phase correction, independent of frequency. However, in other embodiments frequency dependent phase compensation can be provided.

As shown in FIG. 9, this additional phase compensation is also taken into account when performing the phase comparison between the ambient noise signal and the error signal. Specifically, FIG. 9 shows the additional phase compensation value being specified as a complex number in the same way as the phase of the HPF described above, namely being represented by means of a complex number with a magnitude of 1 and a phase equal to the phase compensation value.

As shown in FIG. 9, this complex number representing the additional phase compensation value is multiplied by the complex number representing the phase of the HPF 132 in a multiplier 174.

The resulting output of the multiplier 174 is then added to (or subtracted from) the phase of the ambient noise microphone signal in the adder 160 as described with reference to FIG. 7.

More specifically, the multiplier 174 performs a complex multiplication of the complex number representing the additional phase compensation value and the complex number representing the phase of the HPF 132 to generate a combined correction value.

The phase difference between the ambient noise signal and the error signal can be determined by forming their vector cross product, which will contain a term representing the Sine of the phase angle between them. The sign of the vector cross product then determines which vector leads the other (or put another way, whether the phase of the error signal relative to the ambient noise signal is between 0° and 180°, or between 0° and −180°). If the vector cross product is positive, the phase of the error signal relative to the ambient noise signal is between 0° and 180°. We therefore need to set a threshold at +90° (before making adjustment for the HPF phase and the filter phase error). However, the corrections are calculated assuming a phase from 0° to −180°, it is necessary in that case to flip the correction into the opposite direction by taking its complex conjugate.

Thus, with anc denoting the ambient noise signal, and error denoting the error signal, and with real( ) and imag( ) denoting the real and imaginary parts of a complex number:

if (real(anc).imag(error)−imag(anc).real(error)>0), the combined correction value formed above is replaced by its complex conjugate (that is, the sign of its imaginary part is reversed).

The ambient noise signal is then corrected by being multiplied by the combined correction value (after replacement by its complex conjugate if necessary).

The corrected ambient noise signal is then compared with the error signal. The vector dot product includes a term representing the cosine of the angle between them, so the sign of the vector dot product determines whether the phase angle is above or below the −90 degree threshold. If the signals are nearer in-phase than anti-phase (so we need to increase the ANC gain), the angle is nearer 0° than 180°, and the sign of the dot product is greater than 0.

Thus, with anc' denoting the ambient noise signal after correction by the combined correction value:

if (real(anc').real(error)+imag(anc').imag(error)≥0), the gain is increased, or otherwise the gain is decreased.

This describes an embodiment in which the additional phase compensation value is combined with the phase of the HPF 132, to form a combined correction value that is added to the phase of the ambient noise microphone. However, it will be apparent that the additional phase compensation value can be added to the phase of the ambient noise microphone signal separately from the phase of the HPF 132. It will also be apparent that, just as with the phase of the HPF 132, the additional phase compensation value can equally be subtracted from the phase of the error microphone signal or added to the threshold value used by the phase comparator 148. It will also be apparent that the additional phase compensation value can be added to or subtracted from one of these phases, as appropriate, while the phase of the HPF 132 is added to or subtracted from a different one.

There is thus provided a mechanism for correcting the gain of the noise cancellation system in a manner that takes into consideration any changes to the phase of the noise cancellation signal.

The skilled person will recognise that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA.

The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analog array or similar device in order to configure analog hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. The word "amplify" can also mean "attenuate", i.e. decrease, as well as increase and vice versa and the word "add" can also mean "subtract", i.e. decrease, as well as increase and vice versa. Any reference numerals or labels in the claims shall not be construed so as to limit their scope.

What is claimed is:

1. A method of generating a noise cancellation signal, the method comprising:
   generating an ambient noise signal, representing ambient noise;
   generating a noise cancellation signal, by applying the ambient noise signal to a feedforward filter, wherein the feedforward filter comprises a high-pass filter having an adjustable cut-off frequency, and by applying a controllable gain;
   applying the noise cancellation signal to a loudspeaker, to generate a sound to at least partially cancel the ambient noise; and
   generating an error signal, representing unwanted sound in the region of the loudspeaker, wherein the method further comprises:
   comparing a phase of the ambient noise signal to a phase of the error signal, and controlling said gain on the basis of a result of said comparison, and taking account of a phase shift introduced by said high-pass filter when performing said comparison.

2. A method as claimed in claim 1, wherein the step of taking account of the phase shift introduced by said high-pass filter comprises adding the phase shift to the phase of the ambient noise signal before performing the comparison.

3. A method as claimed in claim 1, wherein the step of taking account of the phase shift introduced by said high-pass filter comprises subtracting the phase shift from the phase of the error signal before performing the comparison.

4. A method as claimed in claim 1, wherein the step of taking account of the phase shift introduced by said high-pass filter comprises adjusting a threshold with which a phase difference between the phase of the ambient noise signal and the phase of the error signal is compared.

5. A method as claimed in claim 1, further comprising taking account of a phase difference uncorrected by said feedforward filter when performing said comparison.

6. A method as claimed in claim 1, comprising adjusting the cut-off frequency of the high-pass filter based on a determination as to whether the ambient noise includes wind noise.

7. A method as claimed in claim 1, comprising adjusting the cut-off frequency of the high-pass filter based on a determination as to whether a level of the noise cancellation signal will overdrive the loudspeaker.

8. A method as claimed in claim 1, comprising adjusting the cut-off frequency of the high-pass filter based on a determination as to whether a level of the noise cancellation signal, combined with a level of a wanted sound signal, will overdrive the loudspeaker.

9. A method as claimed in claim 1, comprising comparing the phase of the ambient noise signal to the phase of the error signal in each of a plurality of analysis frequency bands, and controlling said gain on the basis of a result of said comparisons.

10. A computer program product, embodied on a non-transitory computer readable medium, comprising code for causing a computer to perform a method of generating a noise cancellation signal, the method comprising:
    receiving an ambient noise signal, representing ambient noise;
    generating a noise cancellation signal by applying the ambient noise signal to a feedforward filter, wherein the feedforward filter comprises a high-pass filter having an adjustable cut-off frequency, and by applying a controllable gain;
    applying the noise cancellation signal to a loudspeaker, to generate a sound to at least partially cancel the ambient noise; and
    generating an error signal, representing unwanted sound in the region of the loudspeaker, wherein the method further comprises:
    comparing a phase of the ambient noise signal to a phase of the error signal, and controlling said gain on the basis of a result of said comparison, and taking account of a phase shift introduced by said high-pass filter when performing said comparison.

11. A computer program product as claimed in claim 10 wherein the code is adapted to cause a digital signal processor to carry out the method.

12. A sound reproduction device, comprising a noise cancellation system, wherein the noise cancellation system is adapted to:
    receive an ambient noise signal, representing ambient noise;
    generate a noise cancellation signal by applying the ambient noise signal to a feedforward filter, wherein the feedforward filter comprises a high-pass filter having an adjustable cut-off frequency, and by applying a controllable gain;
    apply the noise cancellation signal to a loudspeaker, to generate a sound to at least partially cancel the ambient noise; and
    generate an error signal, representing unwanted sound in the region of the loudspeaker, wherein the noise cancellation system is further adapted to:
    compare a phase of the ambient noise signal to a phase of the error signal, and control said gain on the basis of a result of said comparison, and taking account of a phase shift introduced by said high-pass filter when performing said comparison.

13. A sound reproduction system, comprising a sound reproduction device as claimed in claim 12 and at least one earphone.

14. A sound reproduction system as claimed in claim 13, wherein the earphone comprises a loudspeaker, a noise microphone, for detecting ambient noise, and an error microphone, positioned in front of the loudspeaker for detecting unwanted sound entering an ear canal of a wearer, when the earphone is being worn normally.

15. A sound reproduction system as claimed in claim 14, wherein the earphone is a supra-aural earphone.

16. A sound reproduction system as claimed in claim 14, wherein the earphone is an intra-concha earphone.

17. A sound reproduction device as claimed in claim 12, comprising a handset, having a loudspeaker, a noise microphone, for detecting ambient noise, and an error microphone, positioned in front of the loudspeaker for detecting unwanted sound entering an ear canal of a user, when the handset is being held to an ear of the user.

\* \* \* \* \*